US 8,008,695 B2

(12) United States Patent
Rhodes et al.

(10) Patent No.: US 8,008,695 B2
(45) Date of Patent: Aug. 30, 2011

(54) IMAGE SENSOR WITH BACKSIDE PASSIVATION AND METAL LAYER

(75) Inventors: Howard E. Rhodes, San Martin, CA (US); Hidetoshi Nozaki, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 74 days.

(21) Appl. No.: 12/129,599

(22) Filed: May 29, 2008

(65) Prior Publication Data
US 2009/0294811 A1    Dec. 3, 2009

(51) Int. Cl.
*H01L 31/062* (2006.01)
(52) U.S. Cl. ........ 257/292; 257/291; 257/369; 257/440; 257/461; 257/432
(58) Field of Classification Search .................. 257/292, 257/297, 291
See application file for complete search history.

(56) References Cited

U.S. PATENT DOCUMENTS

| 6,107,107 | A  | * | 8/2000  | Bruce et al. ..................... 438/14 |
| 6,388,301 | B1 | * | 5/2002  | Tawada et al. ................. 257/436 |
| 6,504,196 | B1 | * | 1/2003  | Rhodes ......................... 257/292 |
| 2003/0025160 | A1 |  | 2/2003  | Suzuki et al. |
| 2003/0170928 | A1 | * | 9/2003  | Shimozono et al. ............ 438/73 |
| 2007/0023799 | A1 | * | 2/2007  | Boettiger ....................... 257/292 |
| 2007/0138470 | A1 | * | 6/2007  | Alieu et al. .................... 257/59 |
| 2008/0283726 | A1 | * | 11/2008 | Uya et al. .................. 250/208.1 |

\* cited by examiner

*Primary Examiner* — Wai Sing Louie
*Assistant Examiner* — Bilkis Jahan
(74) *Attorney, Agent, or Firm* — Blakely Sokoloff Taylor & Zafman LLP

(57) ABSTRACT

An image sensor includes a semiconductor layer that low-pass filters light of different wavelengths. For example, the semiconductor layer proportionately absorbs photons of shorter wavelengths and proportionately passes more photons of longer wavelengths such that the longer wavelength photons often pass through without being absorbed. An imaging pixel having a photodiode is formed on a front surface of the semiconductor layer, where the photodiode is an N⁻ region formed within the P-type region of the semiconductor layer. A P⁺ layer is formed between the N⁻ region of the photodiode and a back surface of the semiconductor layer. A mirror that primarily reflects photons of red and/or infra-red wavelengths is formed on the back surface of the semiconductor layer.

23 Claims, 5 Drawing Sheets

IMAGE SENSOR WITH BACKSIDE PASSIVATION AND METAL LAYER

TECHNICAL FIELD

This disclosure relates generally to imaging sensors, and in particular but not exclusively, relates to front side illuminated imaging sensors.

BACKGROUND INFORMATION

Integrated circuits have been developed to reduce the size of components used to implement circuitry. For example, integrated circuits have been using ever-smaller design features, which reduces the area used to implement the circuitry, such that design features are now well under the wavelengths of visible light. With the ever-decreasing sizes of image sensors and the individual pixels that are part of a sensing array, it is important to more efficiently capture charges that are formed when incident light illuminates the sensing array. Thus, more efficiently capturing photonically generated charges helps to maintain or improve the quality of electronic images captured by the sensing arrays of ever-decreasing sizes.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an image sensor with backside passivation and metal layers are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

Throughout this specification, several terms of art are used. These terms are to take on their ordinary meaning in the art from which they come, unless specifically defined herein or the context of their use would clearly suggest otherwise. "Quantum efficiency" is defined herein as the ratio of the number of carriers generated to the number of photons incident upon an active region of an imaging sensor. "Dark current" is defined herein as the current that flows in an imaging sensor in the absence of incident light on the imaging sensor. "White pixel defect" is defined herein as a pixel in an imaging sensor that includes an active region that has an excessive amount of current leakage.

Figure 1:
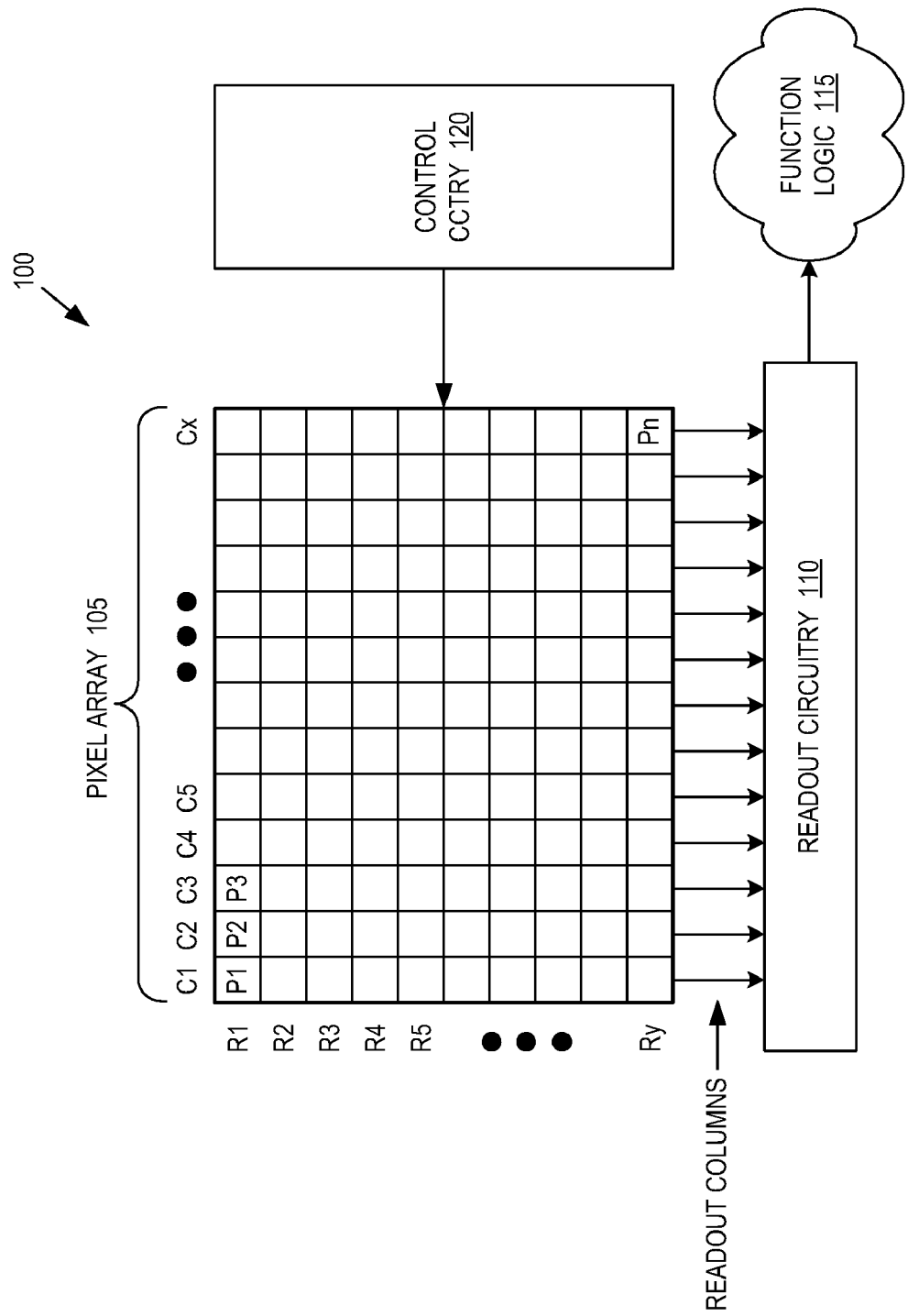
FIG. 1 is a block diagram illustrating an imaging sensor, in accordance with an embodiment of the invention.

FIG. 1 is a block diagram illustrating an imaging sensor 100, in accordance with an embodiment of the invention. The illustrated embodiment of imaging sensor 100 includes a pixel array 105, readout circuitry 110, function logic 115, and control circuitry 120.

Pixel array 105 is a two-dimensional ("2D") array of imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply store the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105. For example, control circuitry 120 may generate a shutter signal for controlling image acquisition.

Figure 2:
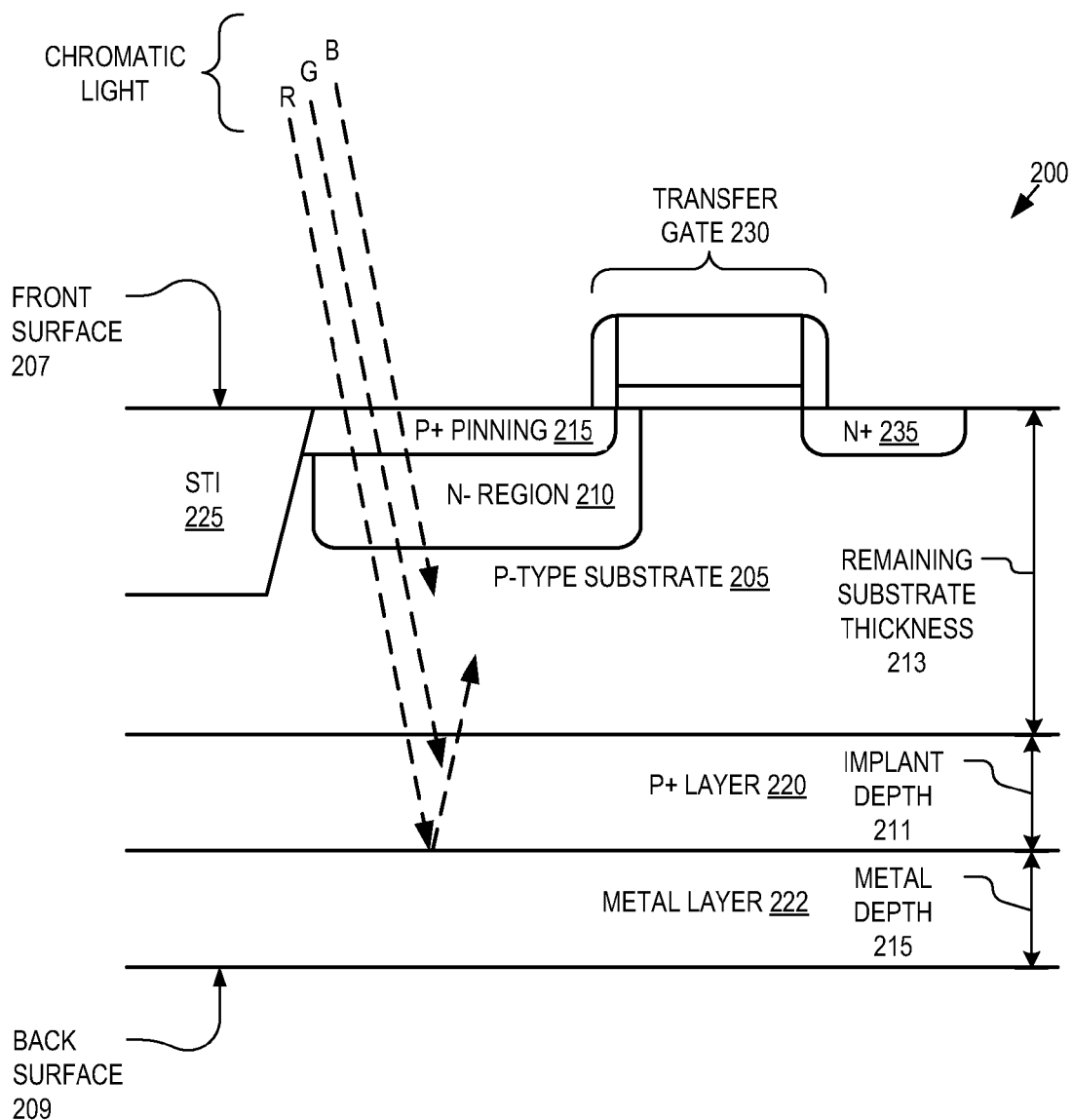
FIG. 2 is a cross-sectional view of an imaging pixel of a frontside illuminated imaging sensor, in accordance with an embodiment of the invention.

FIG. 2 is a cross-sectional view of an imaging pixel 200 of a front side illuminated imaging sensor. Imaging pixel 200 is one possible implementation of at least one pixel of pixel array 105 shown in FIG. 1. The illustrated embodiment of imaging pixel 200 includes a semiconductor layer (i.e., P-type substrate 205). Formed within substrate 205 is a photodiode (i.e., N⁻ region 210), a P⁺ pinning layer 215, a P⁺ implantation layer 220, a shallow trench isolation ("STI") 225, a transfer gate 230, and a floating diffusion (i.e., N⁺ region 235). To help illustrate certain features, the Figure is not necessarily drawn to scale.

Imaging pixel 200 is photosensitive to light incident upon the front surface 207 of substrate 205. In imaging pixel 200, the majority of photon absorption occurs near the back surface 209 of substrate 205. To separate the electron-hole pairs created by photon absorption and drive the electrons to N-region 210, an electric field near back surface 209 of substrate 205 is used. Thus a highly doped P⁺ implantation layer 220 can be created by doping the back surface 209 of substrate 205 to create this electric field. In one embodiment, P⁺ implantation layer 220 is created using boron implantation and laser annealing.

As shown in FIG. 2, a P+ implantation layer is implanted to an implant depth 211, such that there is a remaining substrate thickness 213. In general, greater remaining substrate thickness increases sensitivity of the pixel for longer wavelengths, and increase crosstalk (resulting in reduced sensitivity).

In the illustrated embodiment, implant depth 211 represents the distance that P+ implantation layer extends into substrate 205 as measured from back surface 209. Remaining substrate thickness 213 represents the distance from implant depth 211 to front surface 207. In accordance with the embodiments disclosed herein, implant depth 211, ion concentration of P+ implantation layer 220, and/or remaining substrate thickness 213 may be selected as to increase (e.g., optimize) the spectral and overall performance of imaging pixel 200. For example, by careful selection of implant depth 211, ion concentration, and/or remaining substrate thickness 213, the quantum efficiency and spectral performance of imaging pixel 200 may be increased. In addition, dark current may also be decreased.

In one embodiment, P+ implantation layer 220 is a highly doped boron implantation layer. The boron implantation layer may have a concentration of boron ions selected to increase the quantum efficiency of imaging pixel 200. The boron implantation layer may also have a concentration of boron ions selected to decrease dark current. In one embodiment, boron implantation layer may have a graded concentration of boron ions, where there is a higher concentration of boron ions near back surface 209 than there are at implant depth 211. For example, P+ implantation layer 220 may have a boron ion concentration near back surface 209 in the range of approximately $3 \times 10^{17}$ ions/cm$^3$ to approximately $5 \times 10^{19}$ ions/cm$^3$, while the boron ion concentration near implant depth 211 may be approximately $1 \times 10^{14}$ ions/cm$^3$ to $3 \times 10^{15}$ ions/cm$^3$. In one embodiment, the boron implant of P+ implantation layer 220 may be implemented using boron fluoride ($BF_2$) as the dopant, or diborane ($B_2H_6$) as the dopant source.

As mentioned above, implant depth 211 may also be selected so as to increase quantum efficiency, to increase sensitivity to red and near-IR wavelengths, and to decrease dark current. In one embodiment, implant depth 211 is in the range of approximately 100 nm to approximately 400 nm as measured from the back surface of P+ layer 220. P+ layer 220 is used to passivate the back side of P-type substrate 205 (in preparation for metal layer 222, which would otherwise tend to capture liberated electrons) of imaging pixel 200. (Metal layer 222 can also be comprised of silicides or other suitable reflective material.)

In one embodiment, remaining substrate thickness 213 may have preferred values. For example, a total of remaining substrate thickness 213 and P+ layer 220 may be approximately 1-4 microns, with an exemplary value of 3 microns. Remaining substrate thickness 213 can also be chosen such that metal layer 222 is used to primarily reflect red (and longer) wavelengths of light. Thus, the metal layer formed on the back surface of the semiconductor layer can be used to primarily reflect the photons having longer wavelengths towards the N− region. Metal depth 215 of metal layer 222 generally can be any thickness that is suitable for reflecting light.

Chromatic light rays R, G, and B illustrate light of red, green, and blue wavelengths, respectively. The remaining substrate thickness is chosen such that blue and green light does not generally penetrate as deeply as do longer wavelengths of light within the substrate. Remaining substrate thickness 213 can thus be chosen so that the thickness of the substrate absorbs a majority of photons having shorter wavelengths (e.g., more than half of the photons having wavelengths shorter than red wavelengths are absorbed), while a larger proportion of photons having longer wavelengths are not absorbed. As mentioned above, remaining substrate thickness 213 can also be chosen such that metal layer 222 is used to primarily reflect red (and longer) wavelengths of light (e.g., more than 50% of the photons reflected by the metal layer 222 have red or longer wavelengths of light). Thus, the sensitivity of the pixel for red (and longer) wavelengths of light can be improved by providing metal layer 222, which reflects the typically longer wavelengths back towards the front surface 207, where additional electron hole pairs can be generated (and n-region 210 can capture the liberated electrons). The effective depth (e.g., distance of the top surface of metal layer 222 to front surface 207) can be selected such that a majority of the light reflected by metal layer 222 is a red wavelength (or longer).

Figure 3A:
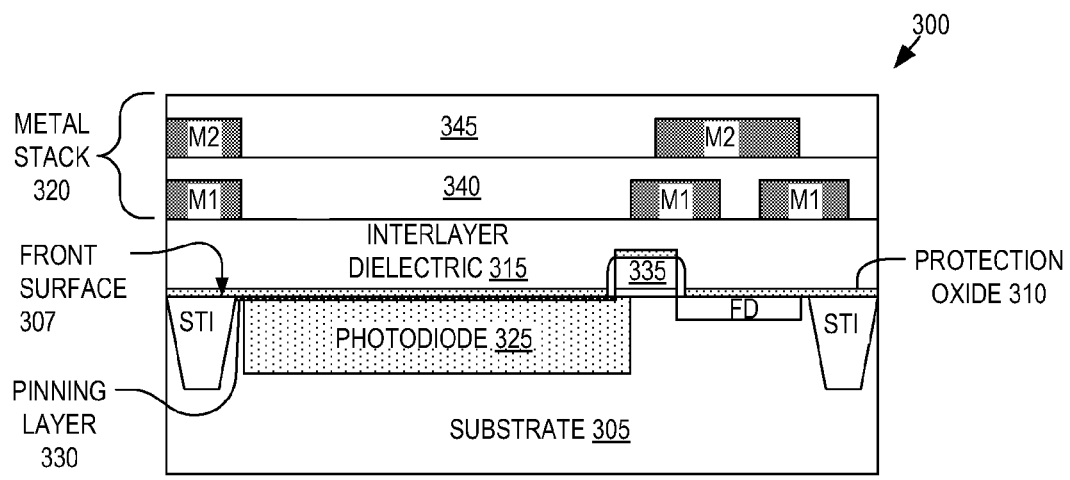
FIGS. 3A-3D illustrate a process of forming an imaging pixel of a frontside illuminated imaging sensor, in accordance with an embodiment of the invention.

FIGS. 3A-3D illustrate a process of forming an imaging pixel 300 of an image sensor, in accordance with an embodiment of the invention. Imaging pixel 300 is one possible implementation of at least one pixel of pixel array 105 shown in FIG. 1. The illustrated embodiment of imaging pixel 300 shown in FIG. 3A incudes a semiconductor layer (i.e., substrate 305), a protection oxide 310, an interlayer dielectric 315, and a metal stack 320. Substrate 305 is illustrated as including shallow trench isolation ("STI") trench, photodiode 325, a floating diffusion ("FD"), and a pinning layer 330. Metal stack 320 is illustrated as including metal interconnect layers M1 and M2, and intermetal dielectric layers 340 and 345. Also illustrated in FIG. 3A is a transfer gate 355.

In the illustrated embodiment of FIG. 3A, photodiode 325 is formed within substrate 305 and is configured to receive light from front surface 307. Photodiode 325 is illustrated as a pinned photodiode by way of optional pinning layer 330. In one embodiment, photodiode 325 may be an unpinned photodiode or a partially pinned photodiode. Additionally, photodiode 325 may be any photosensitive element, such as a photogate or photocapacitor. Furthermore, the term pixel as used herein is meant to encompass all pixel designs, including CCD pixels.

Also included in imaging pixel 300 is transfer gate 335 which is coupled to transfer charge that is accumulated in photodiode 325 to floating diffusion FD. In one embodiment, transfer gate 335 is a polycrystalline silicon (i.e., polysilicon) structure. Coupled to front surface 307 is protection oxide 310 and interlayer dielectric 315. In one embodiment interlayer dielectric 315 is silicon oxide.

As shown in FIG. 3A, imaging pixel 300 includes metal stack 320. The illustrated embodiment of metal stack 320 includes two metal layers M1 and M2 separated by intermetal dielectric layers 340 and 345. Although FIG. 3A illustrates a two layer metal stack, metal stack 320 may include more or less metal layers for routing signals above front surface 307 of substrate 305. In one embodiment metal interconnect layers M1 and M2 are a metal such as aluminum, copper, or alloys of various metals. In one embodiment, metal interconnect layers M1 and M2 are formed by way of sputtering, collimated sputtering, low pressure sputtering, reactive sputtering, electroplating, chemical vapor deposition or evaporation. In one embodiment, transfer gate 335 and floating diffusion FD are electrically coupled to one or more of metal interconnect layers M1 and M2 by way of a hole, via or other connection means (not shown) through protection oxide 310 and interlayer dielectric 315. In one embodiment, a passivation layer (not shown) is disposed over metal stack 320.

Figure 3B:
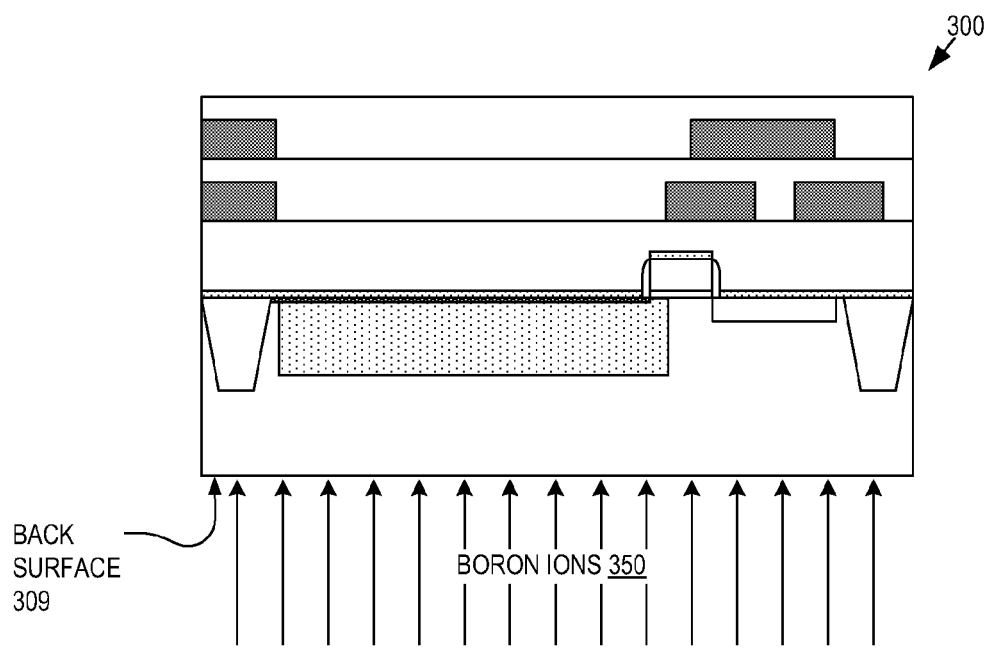

Now referring to FIG. 3B, a boron implant is performed at back surface 309. In one embodiment, the boron implant may be implemented using boron fluoride ($BF_2$) as the dopant, or diborane ($B_2H_6$) as the dopant source. Improved performance of imaging pixel 300 may result from a dose range of boron ions 350 in the range of approximately $3\times10^{13}$ ions/cm$^2$ to approximately $5\times10^{15}$ ions/cm$^2$. Further improved performance of imaging pixel 300 may result from a dose range of boron ions 350 in the range of approximately $1\times10^{14}$ ions/cm$^2$ to approximately $1\times10^{15}$ ions/cm$^2$.

Figure 3C:
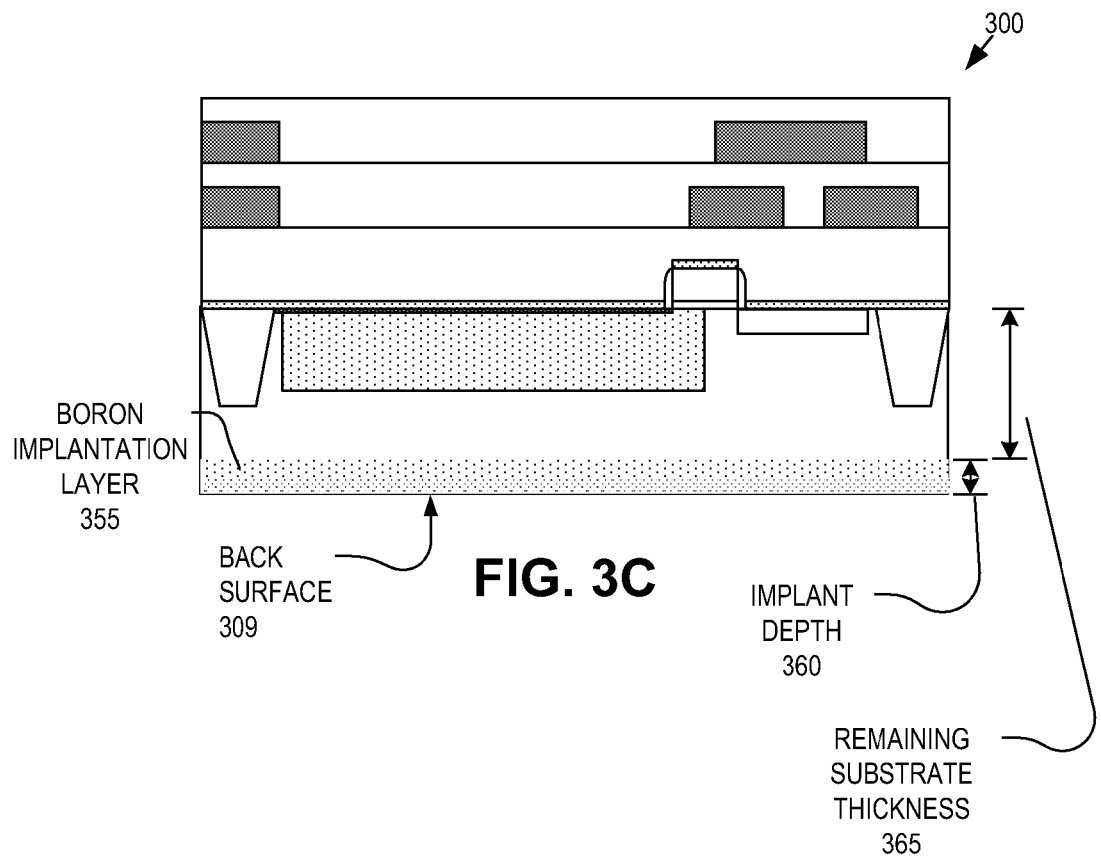

Turning now to FIG. 3C, the resulting boron implantation layer 355 is shown. In one embodiment, implant depth 360 is in the range of approximately 100 nm to approximately 400 nm as measured from back surface 309. In one embodiment, remaining substrate thickness 365 may have preferred values to reflect substantially red values of light (e.g., so that a majority of the reflected light is of a red wavelength or longer). For example, for a 1.75 micron pixel, remaining substrate thickness 365 may be approximately 3 microns.

Figure 3D:
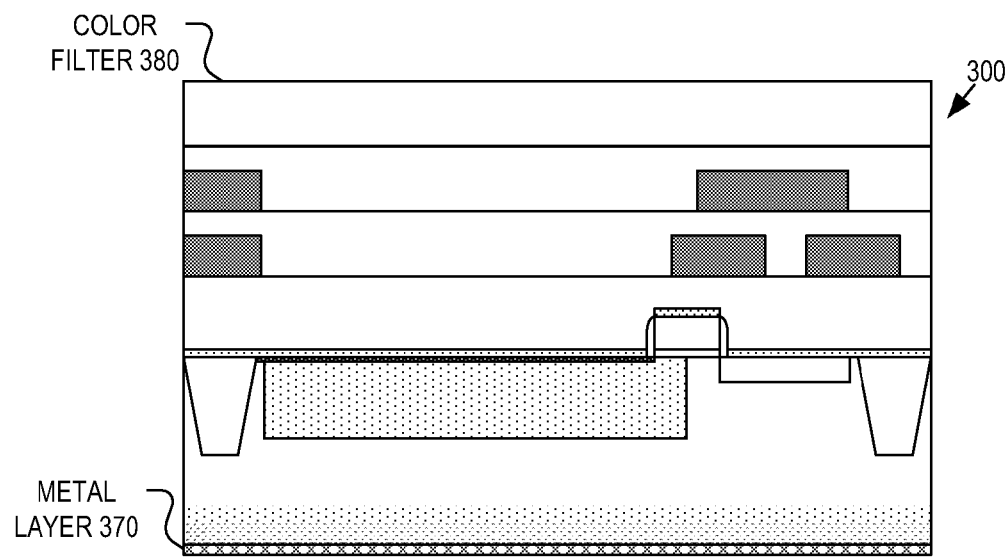

As shown in FIG. 3D, a metal layer 370 is formed on back surface 309. An optional color filter 380 can be formed over the metal stack. For example, a pixel for detecting red light can include a color filter 380 that is red.

Figure 4:
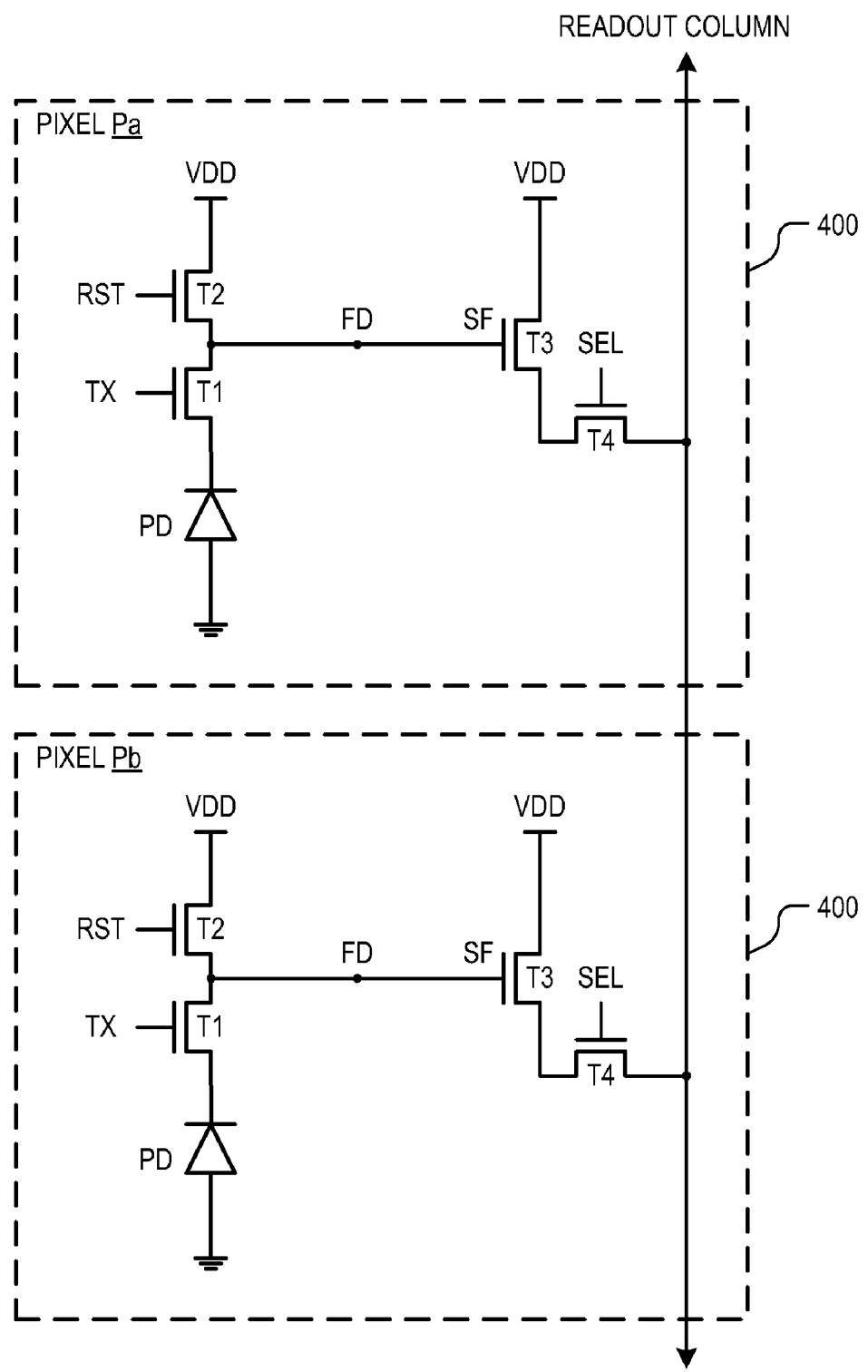
FIG. 4 is a circuit diagram illustrating pixel circuitry of two four-transistor ("4T") pixels within a frontside illuminated imaging array, in accordance with an embodiment of the invention.

FIG. 4 is a circuit diagram illustrating pixel circuitry 400 of two four-transistor ("4T") pixels within a backside illuminated imaging array, in accordance with an embodiment of the invention. Pixel circuitry 400 is one possible pixel circuitry architecture for implementing each pixel within pixel array 100 of FIG. 1, pixel 200 of FIG. 2, or pixel 300 of FIG. 3D. However, it should be appreciated that embodiments of the present invention are not limited to 4T pixel architectures; but that 3T designs, 5T designs, and various other pixel architectures can be used.

In FIG. 4, pixels Pa and Pb are arranged in two rows and one column. The illustrated embodiment of each pixel circuitry 400 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD.

Reset transistor T2 is coupled between a power rail VDD and the floating diffusion node FD to reset (e.g., discharge or charge the FD to a preset voltage) under control of a reset signal RST. The floating diffusion node FD is coupled to the gate of SF transistor T3. SF transistor T3 is coupled between the power rail VDD and select transistor T4. SF transistor T3 operates as a source-follower providing a high impedance output from floating diffusion node FD. Finally, select transistor T4 selectively couples the output of pixel circuitry 400 to the readout column line under control of a select signal SEL. In one embodiment, the TX signal, the RST signal, and the SEL signal are generated by control circuitry 120. The TX signal, the RST signal, the SEL signal, VDD, and ground may be routed in pixel circuitry 400 by way of metal interconnect layers M1 and M2. In one embodiment, transistors T1, T2, T3, and T4, photodiode PD and floating diffusion node FD may be connected as shown in FIG. 4 by way of metal interconnect layers M1 and M2.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A frontside illuminated ("FSI") image sensor, comprising:
   a P-type semiconductor layer;
   an imaging pixel having a photodiode disposed within the P-type semiconductor layer for absorbing photons having shorter wavelengths and longer wavelengths of visible light, wherein the photodiode is an N region formed within the P-type semiconductor layer, wherein the photons are incident upon a frontside of the FSI image sensor;
   a P$^+$ implantation layer disposed within the P-type semiconductor layer between the N region of the photodiode and a back surface of the P-type semiconductor layer, wherein the back surface is opposite to the frontside upon which the photons are incident; and
   a metal layer disposed on the back surface of the P-type semiconductor layer, wherein a thickness of the P-type semiconductor layer is selected such that primarily the photons having the longer wavelengths are reflected by the metal layer back towards the N region while the photons having the shorter wavelengths are substantially absorbed prior to reaching the metal layer.

2. The FSI image sensor of claim 1, wherein the longer wavelengths comprise red wavelengths or wavelengths longer than the red wavelengths.

3. The FSI image sensor of claim 1, wherein the depth of the substrate is 4 microns from a front surface of the semiconductor layer to the back surface of the semiconductor layer.

4. The FSI image sensor of claim 1, wherein the depth of the substrate is selected to absorb a majority of photons that have wavelengths that are shorter than a wavelength of red light.

5. The FSI image sensor of claim 1, wherein the semiconductor layer has a thickness that absorbs a majority of the shorter wavelength photons, and the metal layer formed on the back surface of the semiconductor layer reflects a majority of the photons having longer wavelengths towards the N region.

6. The FSI image sensor of claim 1, wherein the P$^+$ implantation layer includes a boron dopant, wherein the boron implantation layer has an ion concentration selected to reduce dark current.

7. The FSI image sensor of claim 6, wherein the boron implantation layer has a first ion concentration at the back surface of the semiconductor layer and has a second ion concentration at a distance from the back surface of the semiconductor layer, wherein the first ion concentration is greater than the second ion concentration.

8. The FSI image sensor of claim 7, wherein the first ion concentration is in the range of approximately $3\times10^{17}$ ions/cm$^3$ to approximately $5\times10^{19}$ ions/cm$^3$.

9. The FSI image sensor of claim 7, wherein the second ion concentration is approximately $1\times10^{14}$ ions/cm$^3$ to $3\times10^{15}$ ions/cm$^3$, and preferably $3\times10^{14}$ ions/cm$^3$ to $2\times10^{15}$ ions/cm$^3$.

10. The FSI image sensor of claim 9, wherein the distance between the second ion concentration and the back surface of the semiconductor layer is in the range of approximately 100 nm to approximately 400 nm.

11. The FSI image sensor of claim 7, wherein a distance between the second ion concentration and the front surface of the semiconductor layer is selected to increase a quantum efficiency of the imaging pixel.

12. The FSI image sensor of claim 11, wherein the distance between the second ion concentration and the front surface of the semiconductor layer is selected to increase a quantum efficiency of the imaging pixel when photons having red and/or near infra-red wavelengths are reflected towards the N region by the metal layer.

13. The FSI image sensor of claim 11, wherein the imaging pixel is a 1.75 micron complementary metal-oxide-semiconductor ("CMOS") backside illuminated imaging pixel and the distance between the second ion concentration and the front surface of the semiconductor layer is approximately 2 to 4 microns.

14. The FSI image sensor of claim 1, wherein the imaging pixel further includes:
   a floating diffusion region formed on the front surface of the semiconductor layer; and
   a transfer gate coupled between the photodiode and the floating diffusion.

15. The FSI image sensor of claim 1, further comprising a red filter formed above a front surface of the semiconductor layer.

16. The FSI image sensor of claim 1, wherein the metal layer comprises a single continuous unbroken layer disposed under an array of pixels including the imaging pixel.

17. The imaging sensor of claim 1, wherein the P+ implantation layer extends from the back surface of the P-type semiconductor layer upon which the metal layer is disposed.

18. An imaging sensor comprising:
   a semiconductor layer having a front surface and a back surface, the semiconductor layer having a front side illuminated array of CMOS (complementary metal-oxide semiconductor) imaging pixels, wherein each imaging pixel includes:
   a P type region;
   an imaging pixel having a photodiode formed within the semiconductor layer, wherein the photodiode is an N region formed within the P type region;
   a P type implantation layer disposed within the semiconductor layer between the N region of the photodiode and the back surface of the semiconductor layer, wherein the P type implantation layer extends from the back surface of the semiconductor layer; and
   a reflective surface disposed under the P type implantation layer on the back surface of the semiconductor layer, wherein a thickness of the semiconductor layer is selected such that the reflective surface reflects photons including visible red and infra-red wavelengths while shorter visible wavelengths are substantially absorbed prior to reaching the reflective surface.

19. The imaging sensor of claim 18, wherein the P type implantation layer is a boron implantation layer.

20. The imaging sensor of claim 19, wherein the boron implantation layer has a first ion concentration at the back surface of the semiconductor layer and has a second ion concentration at a distance from the back surface of the semiconductor layer, wherein the first ion concentration is greater than the second ion concentration.

21. The imaging sensor of claim 18, wherein each imaging pixel further includes:
   a floating diffusion region formed within the semiconductor layer; and
   a transfer gate coupled between the photodiode and the floating diffusion region.

22. The imaging sensor of claim 18, wherein each imaging pixel is a complementary metal-oxide-semiconductor ("CMOS") frontside illuminated imaging pixel.

23. The imaging sensor of claim 18 wherein the reflective surface comprises at least one of a metal layer or a silicide layer.

* * * * *